(12) United States Patent
Lin et al.

(10) Patent No.: US 7,256,095 B2
(45) Date of Patent: *Aug. 14, 2007

(54) HIGH VOLTAGE METAL-OXIDE-SEMICONDUCTOR TRANSISTOR DEVICES AND METHOD OF MAKING THE SAME

(75) Inventors: Chien-Ming Lin, Hsin-Chu (TW); Ming-Tsung Tung, Hsin-Chu (TW); Chin-Hung Liu, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/468,782

(22) Filed: Aug. 31, 2006

(65) Prior Publication Data

US 2006/0292803 A1    Dec. 28, 2006

Related U.S. Application Data

(63) Continuation-in-part of application No. 10/908,784, filed on May 26, 2005, now Pat. No. 7,118,954.

(51) Int. Cl.
*H01L 21/336* (2006.01)

(52) U.S. Cl. ................ 438/303; 438/305; 257/E21.626

(58) Field of Classification Search ......... 438/303–306
See application file for complete search history.

(56) References Cited

U.S. PATENT DOCUMENTS

| | | | |
|---|---|---|---|
| 4,564,854 A | 1/1986 | Ogura | |
| 4,804,636 A | 2/1989 | Groover, III et al. | |
| 4,890,141 A | 12/1989 | Tang et al. | |
| 5,091,763 A | 2/1992 | Sanchez | |
| 5,250,464 A | 10/1993 | Wong et al. | |
| 6,229,212 B1 | 5/2001 | Dennison et al. | |
| 6,259,131 B1 | 7/2001 | Sung et al. | |
| 6,306,696 B1 | 10/2001 | Dennison et al. | |
| 7,118,954 B1 * | 10/2006 | Lin et al. .................... | 438/201 |
| 2004/0071030 A1 | 4/2004 | Goda et al. | |
| 2004/0227185 A1 | 11/2004 | Matsumoto et al. | |
| 2005/0082582 A1 | 4/2005 | Rhodes | |
| 2005/0145850 A1 | 7/2005 | Dennison et al. | |

* cited by examiner

*Primary Examiner*—H. Jey Tsai
(74) *Attorney, Agent, or Firm*—Winston Hsu

(57) ABSTRACT

A method for fabricating metal-oxide-semiconductor devices is provided. The method includes forming a gate dielectric layer on a substrate; depositing a polysilicon layer on the gate dielectric layer; forming a resist mask on the polysilicon layer; etching the polysilicon layer not masked by the resist mask, thereby forming a gate electrode; etching a thickness of the gate dielectric layer not covered by the gate electrode; stripping the resist mask; forming a salicide block resist mask covering the gate electrode and a portions of the remaining gate dielectric layer; etching away the remaining gate dielectric layer not covered by the salicide block resist mask, thereby exposing the substrate and forming a salicide block lug portions on two opposite sides of the gate electrode; and making a metal layer react with the substrate, thereby forming a salicide layer that is kept a distance "d" away from the gate electrode.

7 Claims, 18 Drawing Sheets

HIGH VOLTAGE METAL-OXIDE-SEMICONDUCTOR TRANSISTOR DEVICES AND METHOD OF MAKING THE SAME

CROSS REFERENCE TO RELATED APPLICATIONS

This application is a continuation-in-part of U.S. application Ser. No. 10/908,784 filed May 26, 2005 now U.S. Pat. No. 7,118,954.

BACKGROUND OF THE INVENTION

1. Field of the Invention

The present invention relates to the fabrication of semiconductor integrated circuits and, more particularly, to an improved process for fabricating high-voltage devices. According to the present invention, the salicide process is integrated with the high-voltage process, thereby reducing the resistance of high-voltage metal-oxide-semiconductor transistor devices.

2. Description of the Prior Art

Integrated circuits (ICs) containing both high-voltage and low-voltage devices such as high/low voltage MOS transistor devices are known in the art. For example, the low-voltage device may be used in the control circuits as the high-voltage device may be used in electrically programmable read only memory (EPROM) or the driving circuits of the liquid crystal display devices.

It is also known that self-aligned silicide (also referred to as "salicide") process is typically utilized to form metal silicide layer such as cobalt silicide or titanium silicide on the gates, source or drain regions in order to reduce sheet resistances. However, the salicide process is merely performed on the low-voltage devices. Considering hot carrier effects, the conventional high-voltage process cannot integrate with the salicide process. As a result, the sheet resistance of the high-voltage devices is high.

In light of the above, there is a need to provide an improved method for reducing the sheet resistance of the high-voltage devices.

SUMMARY OF THE INVENTION

It is the primary object of the present invention to provide an improved high-voltage process for fabricating high-voltage metal-oxide-semiconductor (MOS) devices, thereby reducing the sheet resistance thereof.

According to the claimed invention, a method for fabricating metal-oxide-semiconductor (MOS) devices is disclosed. A gate dielectric layer having a first thickness is formed or grown on a semiconductor substrate. A polysilicon layer is deposited on the gate dielectric layer. A resist mask is formed on the polysilicon layer. The polysilicon layer not masked by the resist mask is etched away, thereby forming a gate electrode. The gate dielectric layer not covered by the gate electrode is then etched such that remaining gate dielectric layer not covered by the gate electrode has a second thickness that is smaller than the first thickness. The resist mask is stripped. A spacer is formed on the sidewalls of the gate electrode and on remaining gate dielectric layer. A salicide block resist mask is formed to cover the gate electrode, the spacer and a portions of remaining the gate dielectric layer laterally protruding an offset "d" from bottom of the gate electrode. The remaining gate dielectric layer not covered by the salicide block resist mask is completely removed, thereby exposing the semiconductor substrate and forming a salicide block lug portions on two opposite sides of the gate electrode with the offset "d" from sidewalls of the gate electrode. The spacer has a maximum thickness that is smaller than the offset "d" such that the salicide block lug portions laterally protruding from bottom of the spacer and forms a step thereto.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIG. 1 to FIG. 9 are schematic cross-sectional diagrams showing major intermediate stages in the process of fabricating high- and low-voltage MOS transistor devices in accordance with one preferred embodiment of the present invention.
Figure 1:
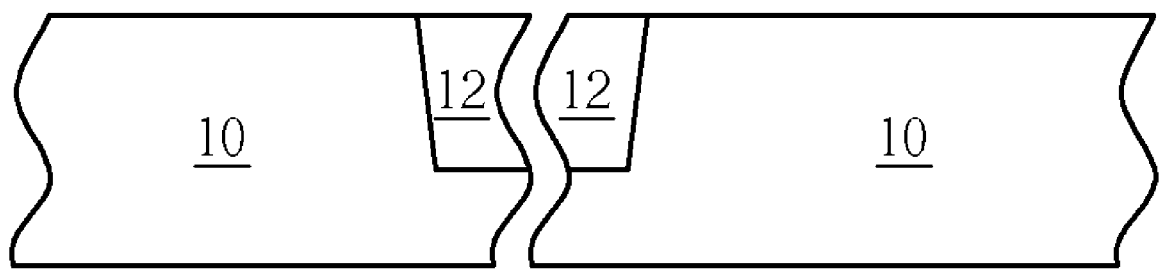

Please refer to FIG. 1 to FIG. 9. FIG. 1 to FIG. 9 are schematic cross-sectional diagrams showing major intermediate stages in the process of fabricating high- and low-voltage MOS transistor devices in accordance with one preferred embodiment of the present invention. As shown in FIG. 1, a semiconductor substrate 10 is prepared. The semiconductor substrate 10 comprises a low-voltage device area 102 and a high-voltage device area 104. Within the low-voltage device area 102, low-voltage devices such as low-voltage (5V, 3.3V or lower) MOS transistors are fabricated. Within the high-voltage device area 104, high-voltage devices such as high-voltage (12V or even higher) MOS transistors are fabricated. Initially, isolation structures 12 such as shallow trench isolation (STI) and active areas are defined on the semiconductor substrate 10 both in the low-voltage device area 102 and high-voltage device area 104.

Figure 2:
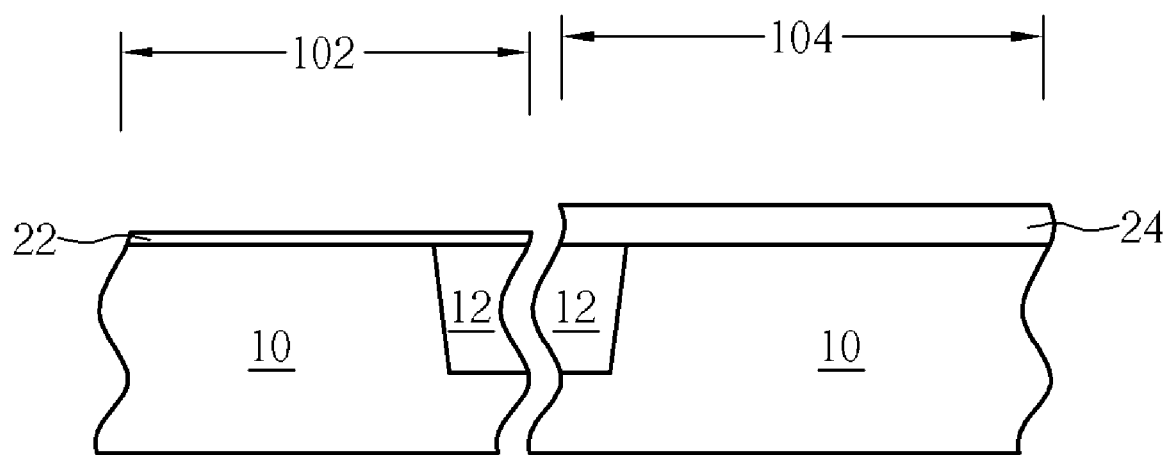

As shown in FIG. 2, a low-voltage gate dielectric 22 and a high-voltage gate dielectric 24 are formed on the surface of the semiconductor substrate 10 within the low-voltage device area 102 and high-voltage device area 104, respectively. Techniques of forming gate dielectrics with two different thicknesses are known in the art, and are not discussed further. According to the preferred embodiment, the low-voltage gate dielectric 22 has a thickness that is less than 200 angstroms, preferably less than or equal to 100 angstroms, while the high-voltage gate dielectric 24 has a thickness that is thicker than 300 angstroms, preferably thicker than 600 angstroms.

Figure 3:
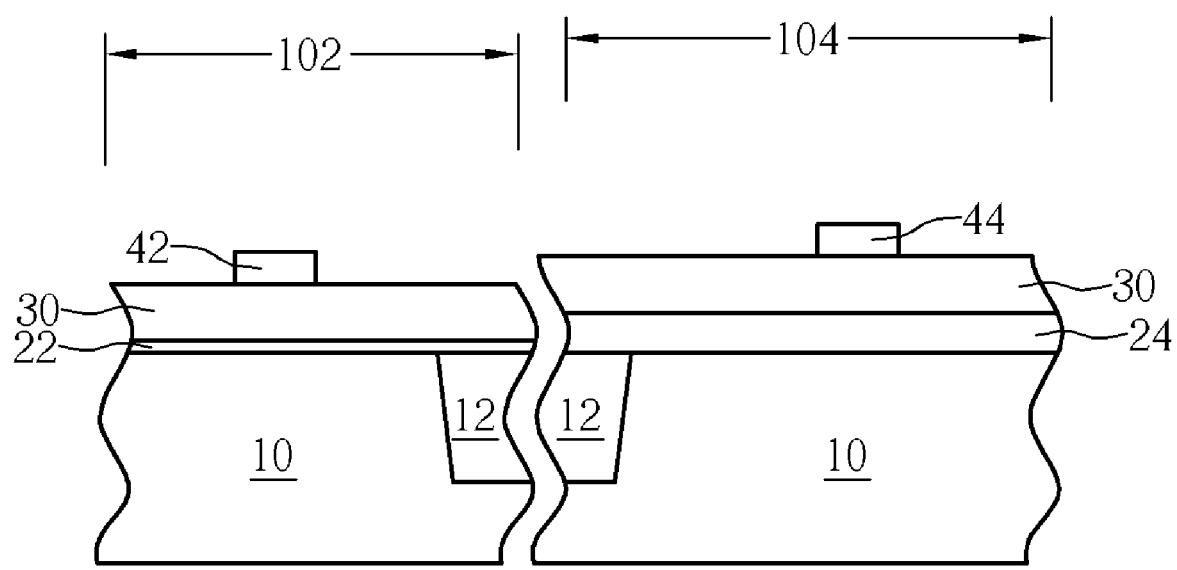

As shown in FIG. 3, a polysilicon layer 30 is deposited on the low-voltage gate dielectric 22 and on the high-voltage gate dielectric 24. A photoresist mask 42 and photoresist mask 44 are defined on the polysilicon layer 30, wherein the photoresist mask 42 defines the gate pattern of a low-voltage MOS transistor device within the low-voltage device area 102, while the photoresist mask 44 defines the gate pattern of a high-voltage MOS transistor device within the high-voltage device area 104.

Figure 4:
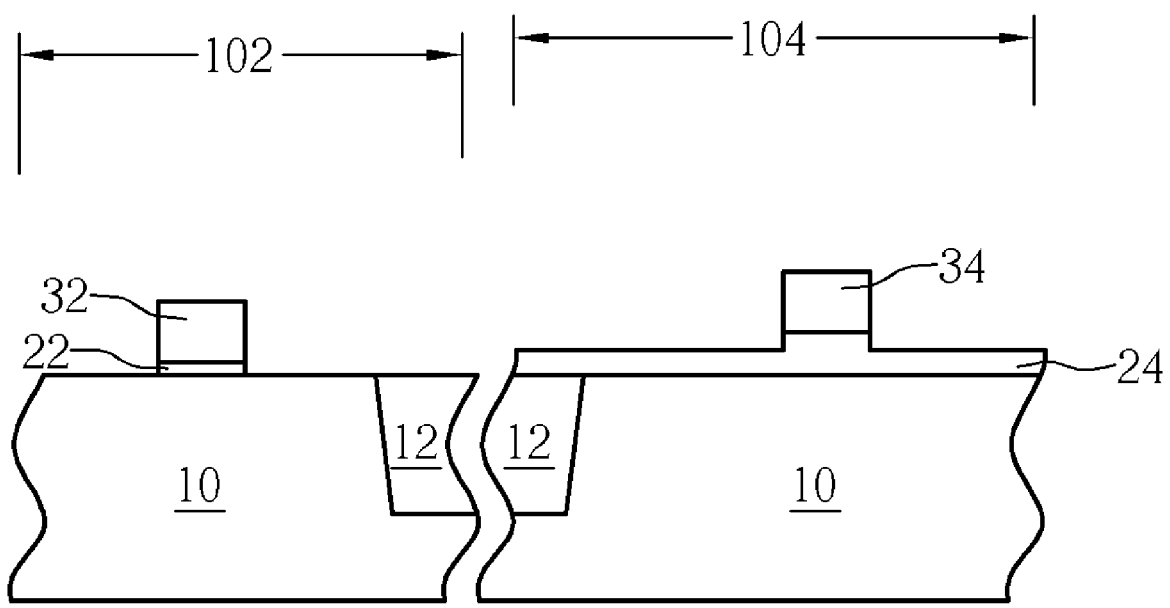

Subsequently, as shown in FIG. 4, using the photoresist masks 42 and 44 as an etching hard mask, a plasma dry etching is carried out to etched away the polysilicon layer 30 that is not covered by the photoresist masks 42 and 44, thereby forming a gate electrode 32 of the low-voltage MOS transistor device and gate electrode 34 of the high-voltage MOS transistor device. The low-voltage dielectric 22 outside the gate electrode 32 is etched away to expose the semiconductor substrate 10. The aforesaid plasma dry etching is not terminated until a predetermined thickness of the thicker high-voltage dielectric 24 is removed. At this phase, the remaining high-voltage dielectric 24 still covers the high-voltage device area 104.

Figure 5:
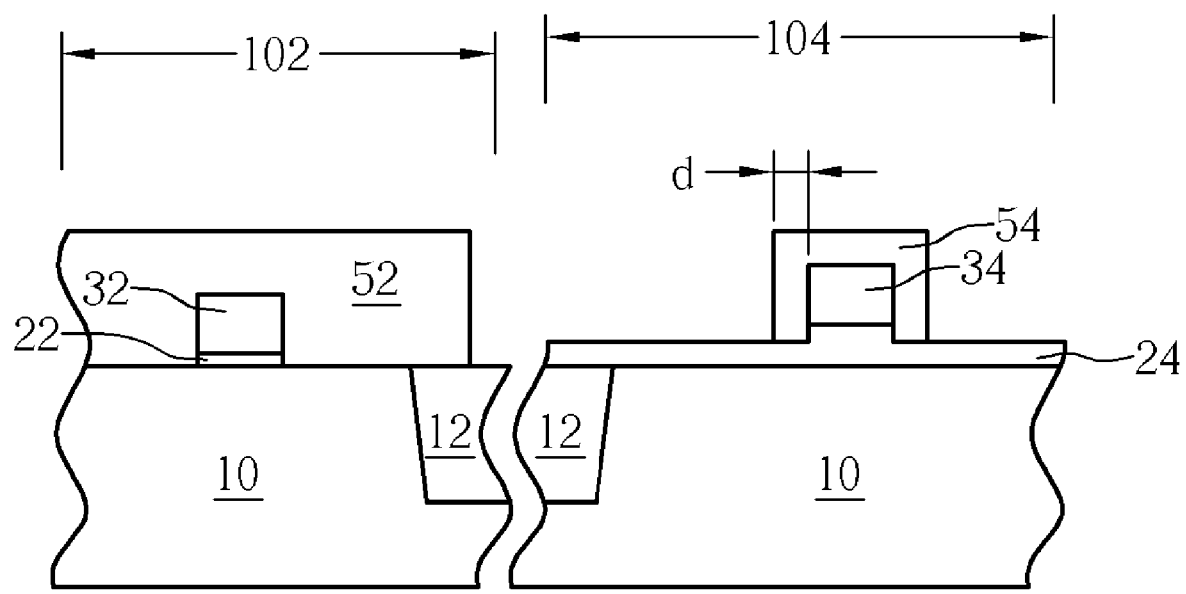

As shown in FIG. 5, a layer of photoresist (not explicitly shown) is coated over the semiconductor substrate 10, and is then exposed and developed using conventional lithography to form photoresist mask 52 and photoresist mask 54. The photoresist mask 52 covers the entire low-voltage device area 102, while the photoresist mask 54 merely masks the gate electrode 34 and a portions of the remaining high-voltage dielectric 24 laterally protruding an offset "d" from the bottom of the gate electrode 34. The offset "d" is substantially equal to the distance between the gate electrode 34 and the source/drain salicide formed in the subsequent processes.

Figure 6:
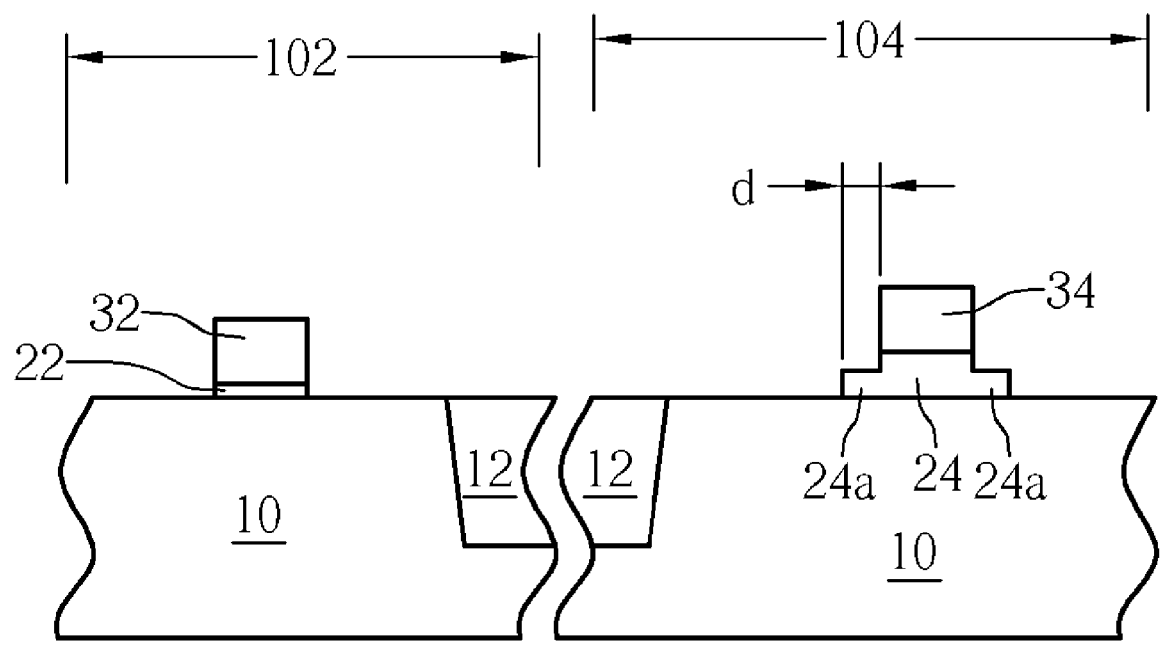

As shown in FIG. 6, using the photoresist mask 52 and photoresist mask 54 as a hard mask, a plasma dry etching is carried out to etch away the remaining high-voltage dielectric 24 that is not covered by the photoresist mask 54. Thereafter, the photoresist mask 52 and photoresist mask 54 are stripped off. The remaining high-voltage dielectric 24 that is not directly under the gate electrode 34 is hereinafter referred to as lug portions 24a that are formed on two opposite sides of the gate electrode 34 with an offset "d" from the gate sidewalls. According to the preferred embodiment, the lug portions 24a have a thickness of about 100~600 angstroms, and the offset "d" is in a range of about 0.4~2.0 micrometers.

Figure 7:
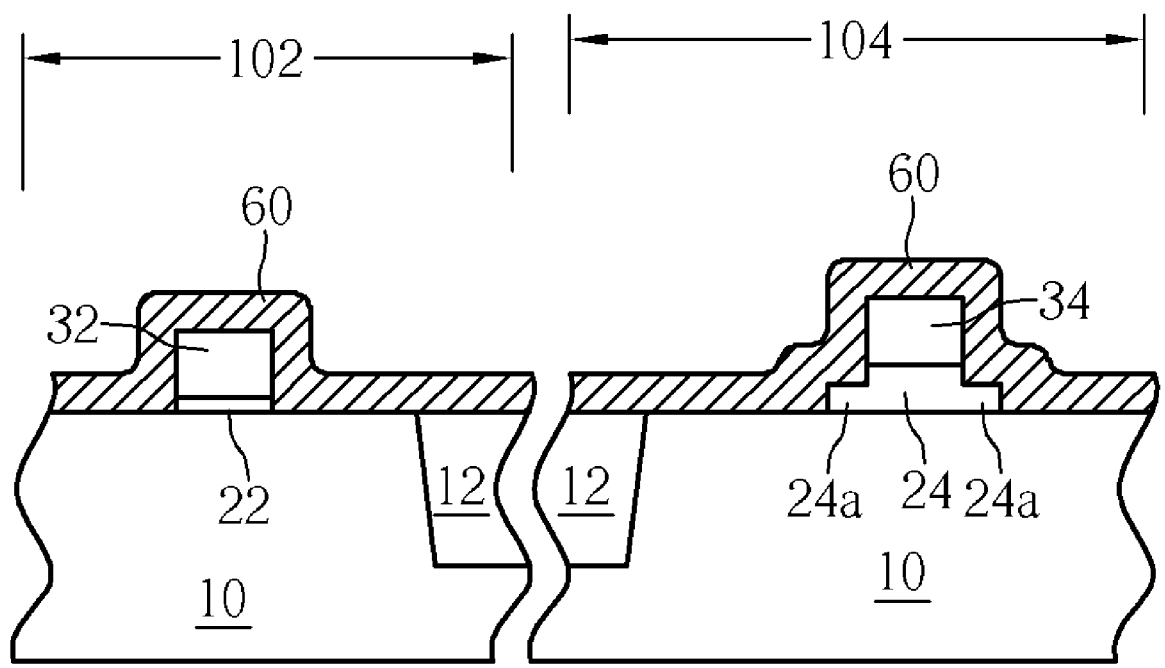
Figure 8:
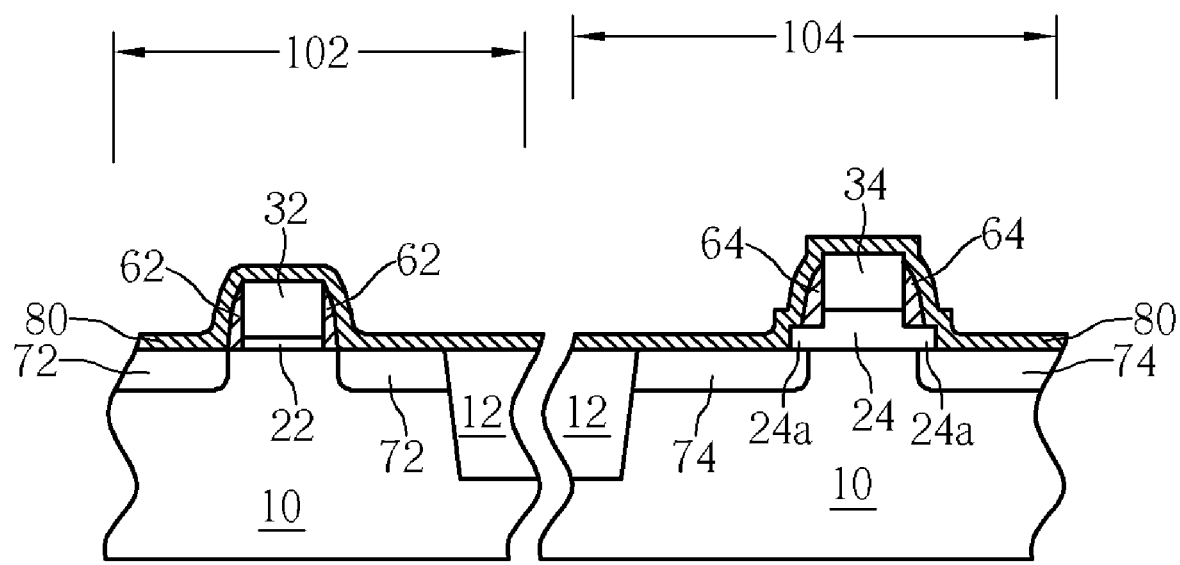

As shown in FIG. 7, a spacer dielectric layer 60 such as silicon nitride is deposited over the semiconductor substrate 10. Next, as shown in FIG. 8, an isotropic dry etching is carried out to etch the spacer dielectric layer 60, thereby forming spacers 62 and 64 on sidewalls of respective gate electrodes 32 and 34. Conventional ion implantation process is then performed to form source/drain regions 72 within the low-voltage device area 102 and source/drain regions 74 within the low-voltage device area 104. After the implantation of source/drain regions, a typical salicide process is carried out. A metal layer 80 such as cobalt or titanium is deposited over the semiconductor substrate 10. The metal layer 80 covers both the low-voltage device area 102 and high-voltage device area 104. It is one feature of the present invention that the lug portions 24a function as a salicide block that keeps the metal layer 80 from contacting the substrate within the offset area directly under the lug portions 24a.

Figure 9:
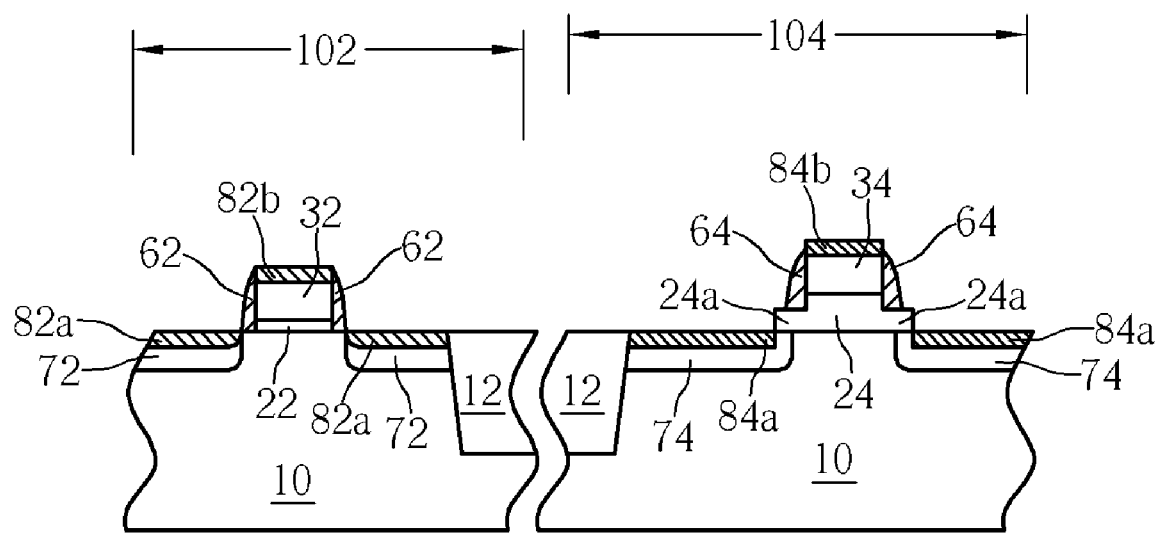

Finally, as shown in FIG. 9, a thermal process is performed. The source/drain regions 72 and 74 that are in contact with the metal layer 80 react with the overlying metal layer 80 to form metal salicide layers 82a and 84a. Simultaneously, metal salicide layers 82b and 84b are formed on the exposed gate electrodes 32 and 34.

Figure 10:
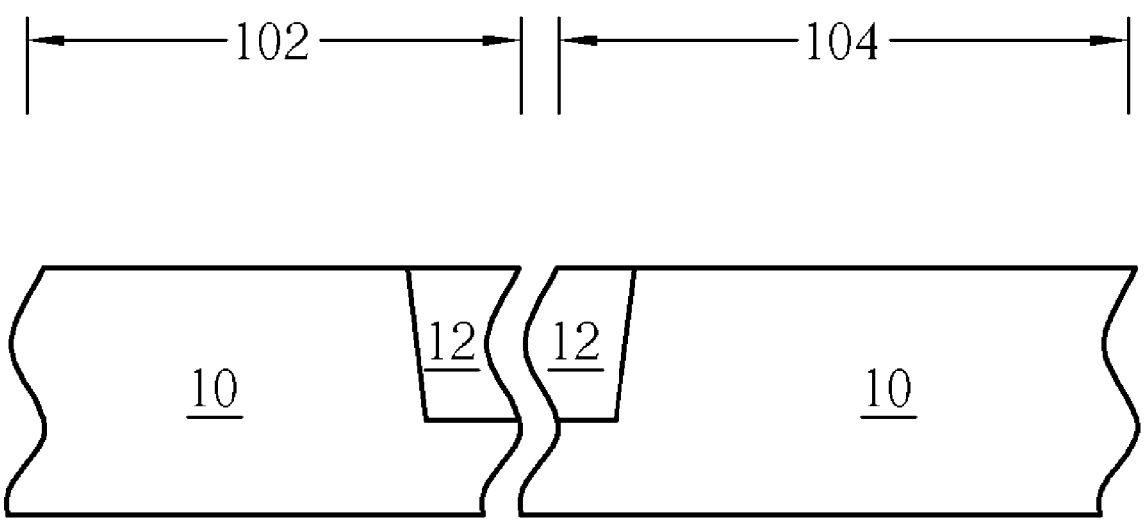
FIG. 10 to FIG. 18 are schematic cross-sectional diagrams showing major intermediate stages in the process of fabricating high- and low-voltage MOS transistor devices in accordance with another preferred embodiment of the present invention.

FIG. 10 to FIG. 18 are schematic cross-sectional diagrams showing major intermediate stages in the process of fabricating high- and low-voltage MOS transistor devices in accordance with another preferred embodiment of the present invention. As shown in FIG. 10, likewise, the semiconductor substrate 10 comprises a low-voltage device area 102 and a high-voltage device area 104. Within the low-voltage device area 102, low-voltage devices such as low-voltage (5V, 3.3V or lower) MOS transistors are fabricated. Within the high-voltage device area 104, high-voltage devices such as high-voltage (12V or even higher) MOS transistors are fabricated. Initially, isolation structures 12 such as shallow trench isolation (STI) and active areas are defined on the semiconductor substrate 10 both in the low-voltage device area 102 and high-voltage device area 104.

Figure 11:
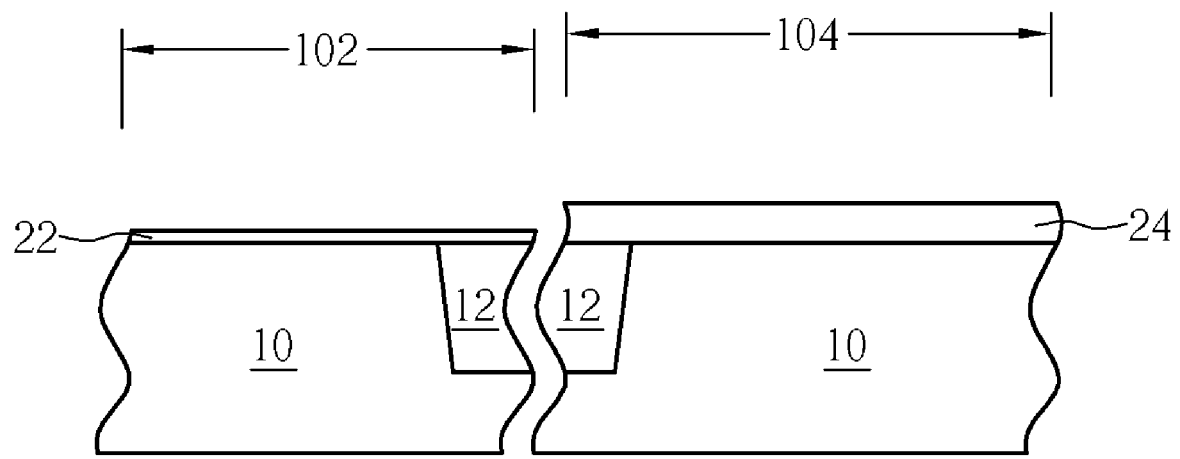

As shown in FIG. 11, a low-voltage gate dielectric 22 and a high-voltage gate dielectric 24 are formed on the surface of the semiconductor substrate 10 within the low-voltage device area 102 and high-voltage device area 104, respectively. According to the preferred embodiment, the low-voltage gate dielectric 22 has a thickness that is less than 200 angstroms, preferably less than or equal to 100 angstroms, while the high-voltage gate dielectric 24 has a thickness that is thicker than 300 angstroms, preferably thicker than 600 angstroms.

Figure 12:
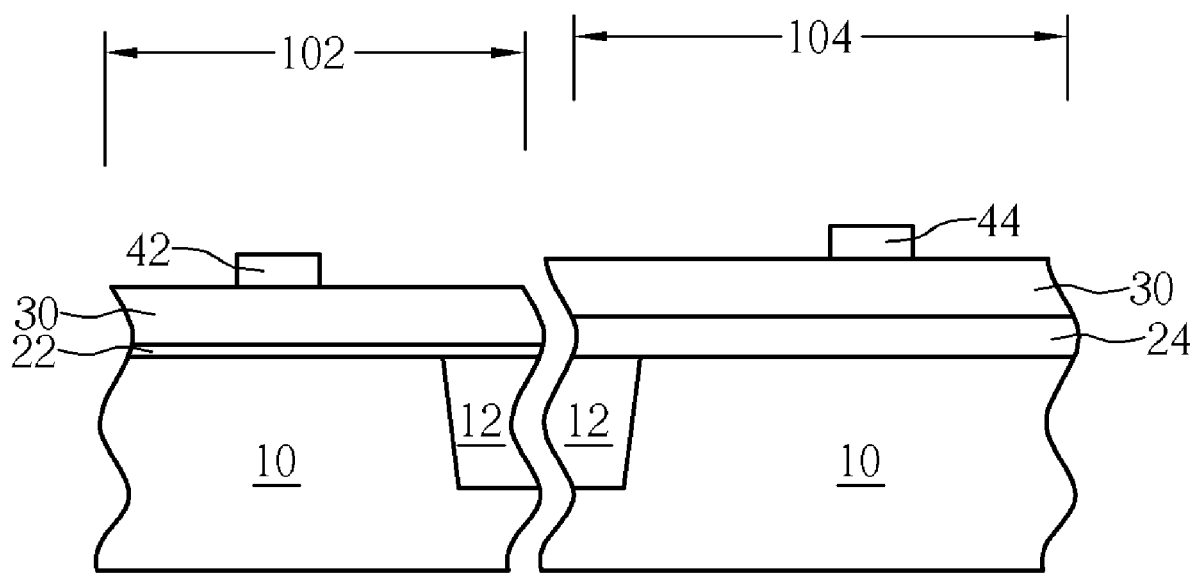

As shown in FIG. 12, a polysilicon layer 30 is deposited on the low-voltage gate dielectric 22 and on the high-voltage gate dielectric 24. A photoresist mask 42 and photoresist mask 44 are defined on the polysilicon layer 30, wherein the photoresist mask 42 defines the gate pattern of a low-voltage MOS transistor device within the low-voltage device area 102, while the photoresist mask 44 defines the gate pattern of a high-voltage MOS transistor device within the high-voltage device area 104.

Figure 13:
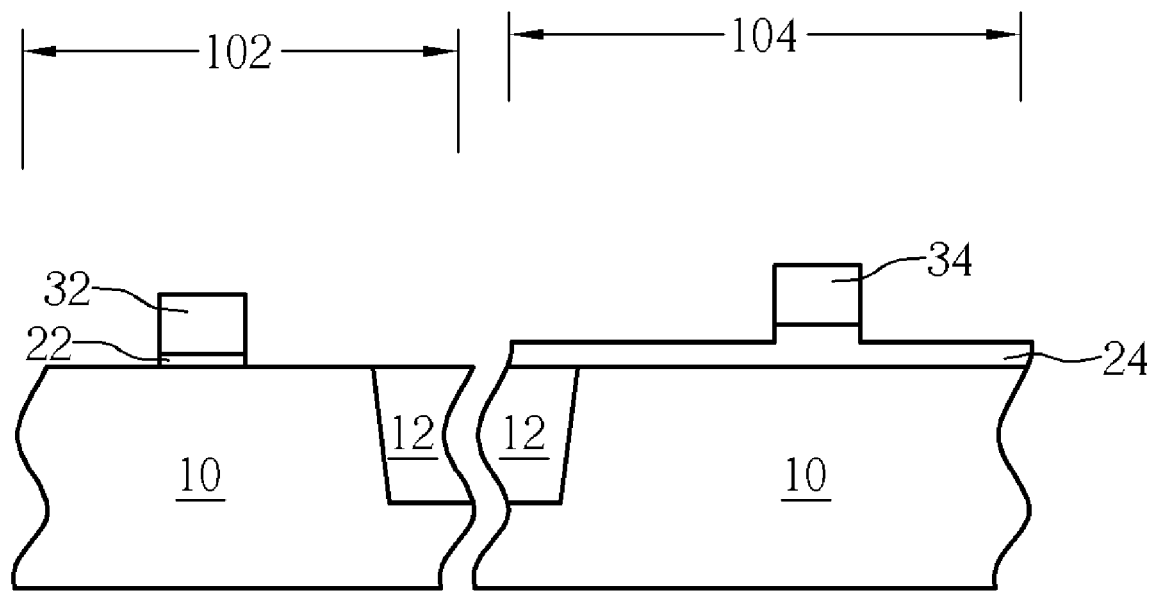

Subsequently, as shown in FIG. 13, using the photoresist masks 42 and 44 as an etching hard mask, a plasma dry etching is carried out to etched away the polysilicon layer 30 that is not covered by the photoresist masks 42 and 44, thereby forming a gate electrode 32 of the low-voltage MOS transistor device and gate electrode 34 of the high-voltage MOS transistor device. The low-voltage dielectric 22 outside the gate electrode 32 is etched away to expose the semiconductor substrate 10. The aforesaid plasma dry etching is not terminated until a predetermined thickness of the thicker high-voltage dielectric 24 is removed. At this phase, the remaining high-voltage dielectric 24 still covers the high-voltage device area 104.

Figure 14:
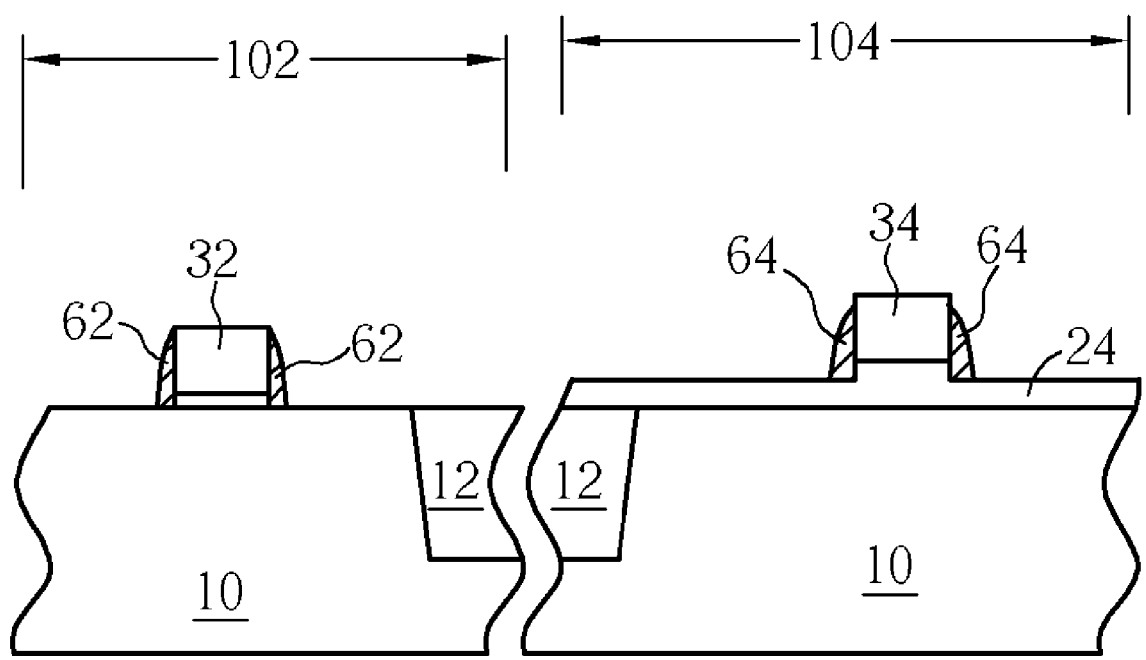

As shown in FIG. 14, spacer 62 and spacer 64 are formed on sidewalls of gate electrodes 32 and 34, respectively. One difference between this embodiment and previous embodiment is that in this embodiment the spacers 62 and 64 are formed prior to the formation of the lug portions 24a.

Figure 15:
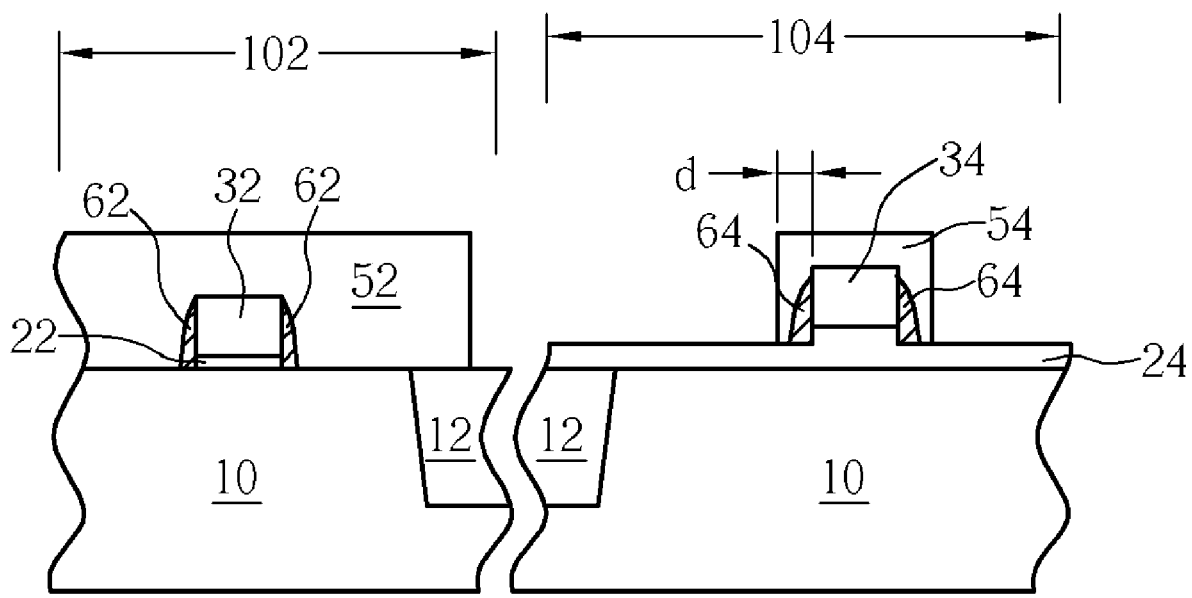

As shown in FIG. 15, a layer of photoresist (not explicitly shown) is coated over the semiconductor substrate 10, and is then exposed and developed using conventional lithography to form photoresist mask 52 and salicide block photoresist mask 54. The photoresist mask 52 covers the entire low-voltage device area 102, while the salicide block photoresist mask 54 merely masks the gate electrode 34, spacer 64 and a portions of the remaining high-voltage dielectric 24 laterally protruding an offset "d" from the bottom of the gate electrode 34. The offset "d" is substantially equal to the distance between the gate electrode 34 and the source/drain salicide to be formed in the subsequent processes.

Figure 16:
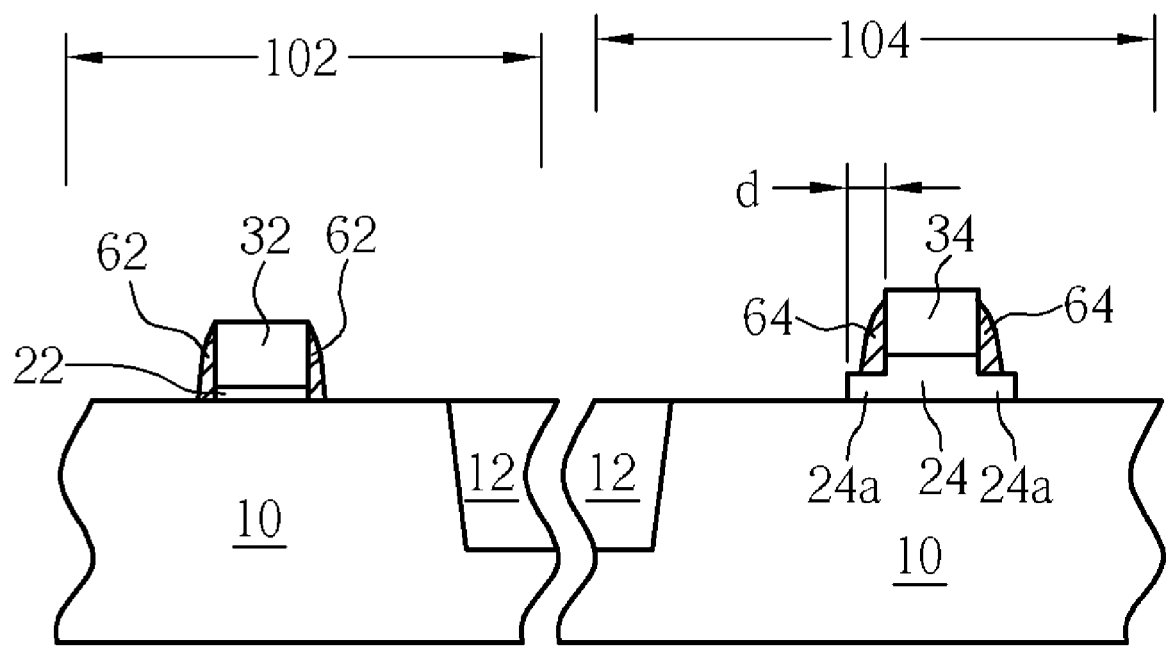

As shown in FIG. 16, using the photoresist mask 52 and salicide block photoresist mask 54 as a hard mask, a plasma dry etching is carried out to etch away the remaining high-voltage dielectric 24 that is not covered by the salicide block photoresist mask 54, thereby forming lug portions 24a. The spacer 64 has a maximum thickness that is smaller than the offset "d" such that the salicide block lug portions 24*a* laterally protruding from bottom of the spacer 64 and forms a step thereto.

Thereafter, the photoresist mask 52 and photoresist mask 54 are stripped off. The lug portions 24*a* are formed on two opposite sides of the gate electrode 34 and protruding with an offset "d" from bottom of the gate sidewalls. According to the preferred embodiment, the lug portions 24*a* have a thickness of about 100~600 angstroms, and the offset "d" is in a range of about 0.4~2.0 micrometers.

Figure 17:
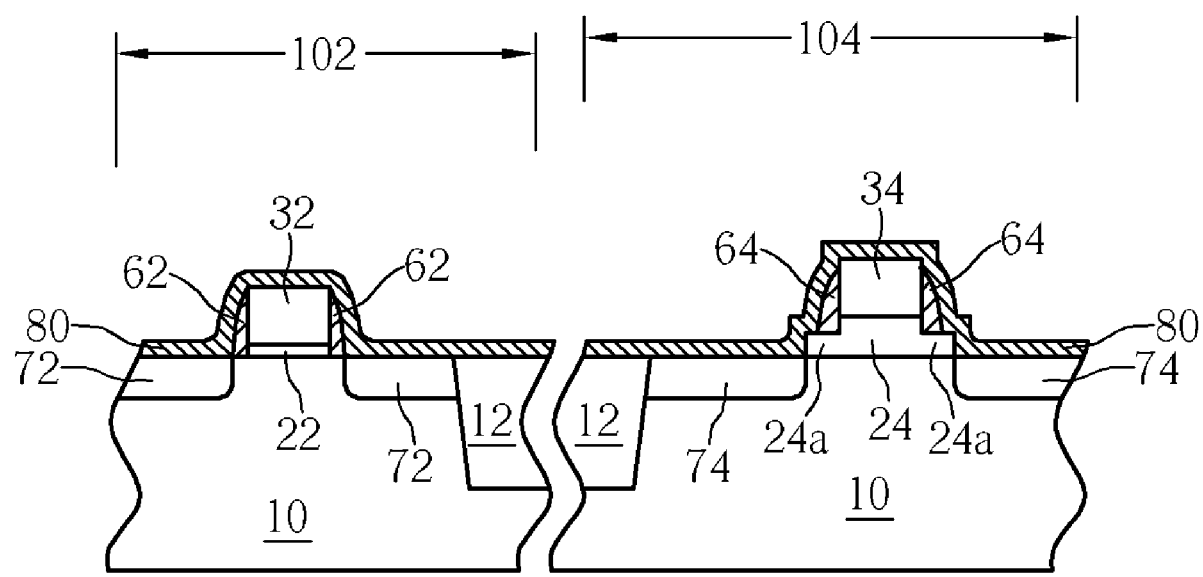

As shown in FIG. 17, ion implantation processes are performed to form source/drain regions 72 within the low-voltage device area 102 and source/drain regions 74 within the low-voltage device area 104. After the implantation of source/drain regions, likewise, a typical salicide process is carried out. A metal layer 80 such as cobalt or titanium is deposited over the semiconductor substrate 10. The metal layer 80 covers both the low-voltage device area 102 and high-voltage device area 104. The lug portions 24*a* function as a salicide block that keeps the metal layer 80 from contacting the substrate within the offset area directly under the lug portions 24*a*.

Figure 18:
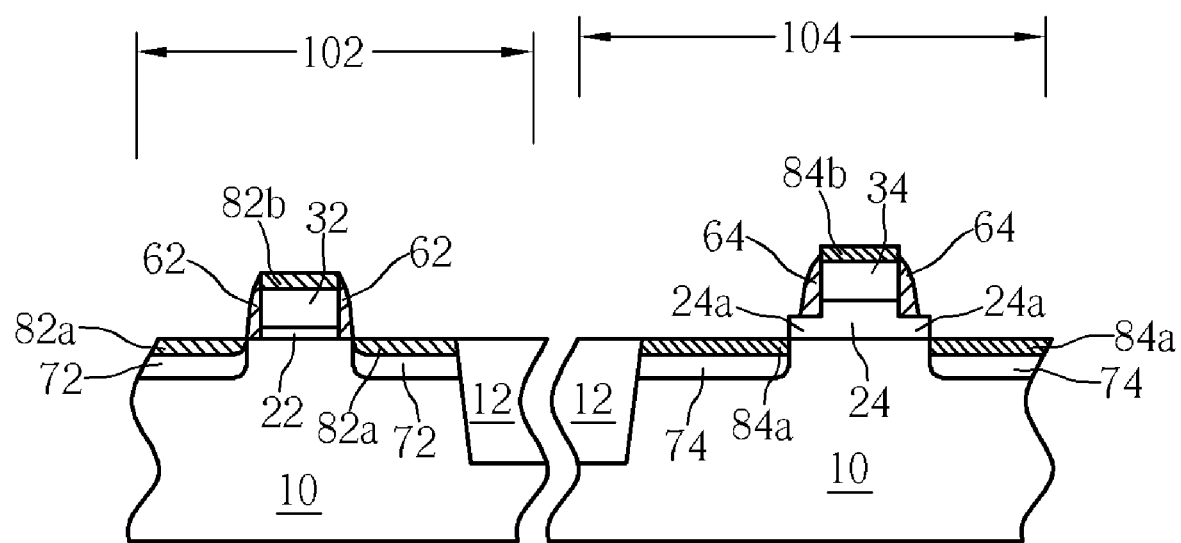

Finally, as shown in FIG. 18, a thermal process is performed. The source/drain regions 72 and 74 that are in contact with the metal layer 80 react with the overlying metal layer 80 to form metal salicide layers 82*a* and 84*a*. Simultaneously, metal salicide layers 82*b* and 84*b* are formed on the exposed gate electrodes 32 and 34.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating metal-oxide-semiconductor devices, comprising:
    providing a semiconductor substrate;
    forming a gate dielectric layer having a first thickness on said semiconductor substrate;
    depositing a polysilicon layer on said gate dielectric layer;
    forming a resist mask on said polysilicon layer;
    etching said polysilicon layer not masked by said resist mask, thereby forming a gate electrode;
    etching said gate dielectric layer not covered by said gate electrode such that remaining said gate dielectric layer not covered by said gate electrode has a second thickness that is smaller than said first thickness;
    forming a spacer on said sidewalls of said gate electrode and on remaining said gate dielectric layer;
    forming a salicide block resist mask covering said gate electrode, said spacer and a portions of remaining said gate dielectric layer laterally protruding an offset "d" from bottom of said gate electrode; and
    etching away remaining said gate dielectric layer not covered by said salicide block resist mask, thereby exposing said semiconductor substrate and forming a salicide block lug portions on two opposite sides of the gate electrode with said offset "d" from sidewalls of said gate electrode; wherein said spacer has a maximum thickness that is smaller than said offset "d" such that said salicide block lug portions laterally protruding from bottom of said spacer and forms a step thereto.

2. The method of claim 1 wherein said first thickness is greater than 300 angstroms.

3. The method of claim 1 wherein said second thickness is greater than 100 angstroms.

4. The method of claim 1 wherein said offset "d" is in a range of 0.4~2.0 micrometers.

5. The method of claim 1 wherein the metal-oxide-semiconductor devices are high-voltage (12V or higher voltage) metal-oxide-semiconductor devices.

6. The method of claim 1 wherein after etching away remaining said gate dielectric layer not covered by said salicide block resist mask, the method further comprises the following steps:
    depositing a metal layer over said semiconductor substrate; and
    making said metal layer react with said semiconductor substrate, thereby forming a salicide layer that is situated a lateral distance "d" away from said gate electrode.

7. The method of claim 6 wherein said metal layer comprises cobalt and titanium.

* * * * *